(12) United States Patent
Breingan et al.

(10) Patent No.: US 10,559,488 B2
(45) Date of Patent: Feb. 11, 2020

(54) TWO-LEVEL TAPE FRAME RINSE ASSEMBLY

(71) Applicant: VEECO PRECISION SURFACE PROCESSING LLC, Horsham, PA (US)

(72) Inventors: William Gilbert Breingan, Media, PA (US); John Taddei, Jim Thorpe, PA (US); James Swallow, Horsham, PA (US)

(73) Assignee: VEECO PRECISION SURFACE PROCESSING LLC, Horsham, PA (US)

( * ) Notice: Subject to any disclaimer, the term of this patent is extended or adjusted under 35 U.S.C. 154(b) by 0 days.

(21) Appl. No.: 15/670,578

(22) Filed: Aug. 7, 2017

(65) Prior Publication Data

US 2018/0047612 A1 Feb. 15, 2018

Related U.S. Application Data

(60) Provisional application No. 62/373,096, filed on Aug. 10, 2016.

(51) Int. Cl.
*H01L 21/683* (2006.01)
*H01L 21/67* (2006.01)
*H01L 21/687* (2006.01)
*H01L 21/02* (2006.01)

(52) U.S. Cl.
CPC .... *H01L 21/6838* (2013.01); *H01L 21/02052* (2013.01); *H01L 21/67028* (2013.01); *H01L 21/67034* (2013.01); *H01L 21/67051* (2013.01); *H01L 21/68707* (2013.01); *H01L 21/68728* (2013.01); *H01L 21/68742* (2013.01)

(58) Field of Classification Search
CPC . H01L 21/687; H01L 21/683; H01L 21/6838; H01L 21/68714; H01L 21/68728; H01L 21/68742; H01L 21/6875; H01L 21/68757; H01L 21/68764; H01L 21/68785; H01L 21/67034
See application file for complete search history.

(56) References Cited

U.S. PATENT DOCUMENTS

| 2010/0200545 A1* | 8/2010 | Koelmel | C23C 16/4584 216/58 |
| 2011/0034034 A1* | 2/2011 | Du Bois | C23C 16/4585 438/758 |
| 2017/0330783 A1* | 11/2017 | Torii | B24B 37/30 |
| 2019/0025096 A1* | 1/2019 | Wen | G01D 5/46 |

* cited by examiner

*Primary Examiner* — Spencer E Bell
(74) *Attorney, Agent, or Firm* — Leason Ellis LLP

(57) ABSTRACT

A two-level tape frame rinse assembly is configured for grasping the substrate so as to create a gap between the substrate and a backside support plate that allows the backside of the wafer to be rinsed and spun dry after rinsing.

14 Claims, 9 Drawing Sheets

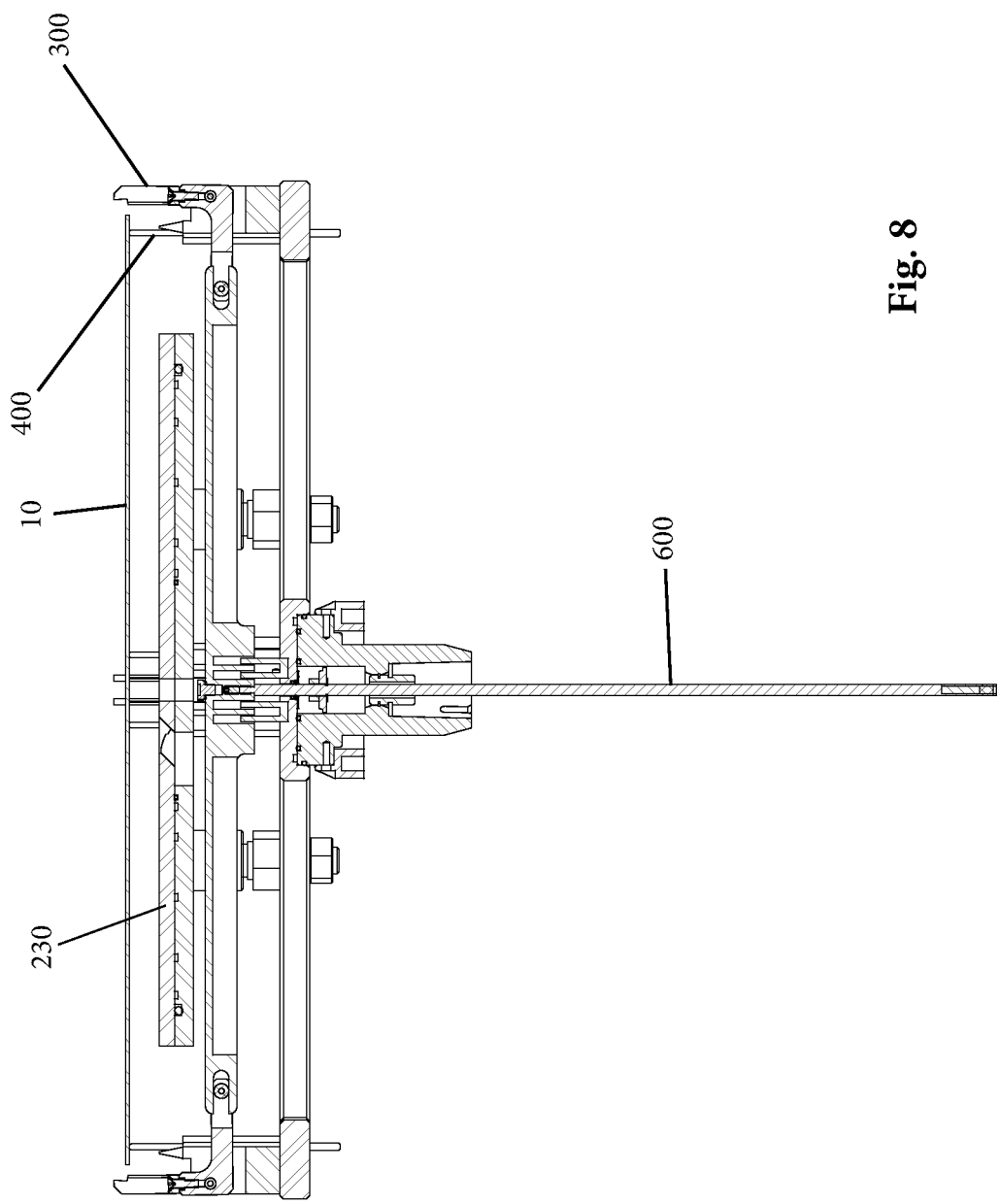

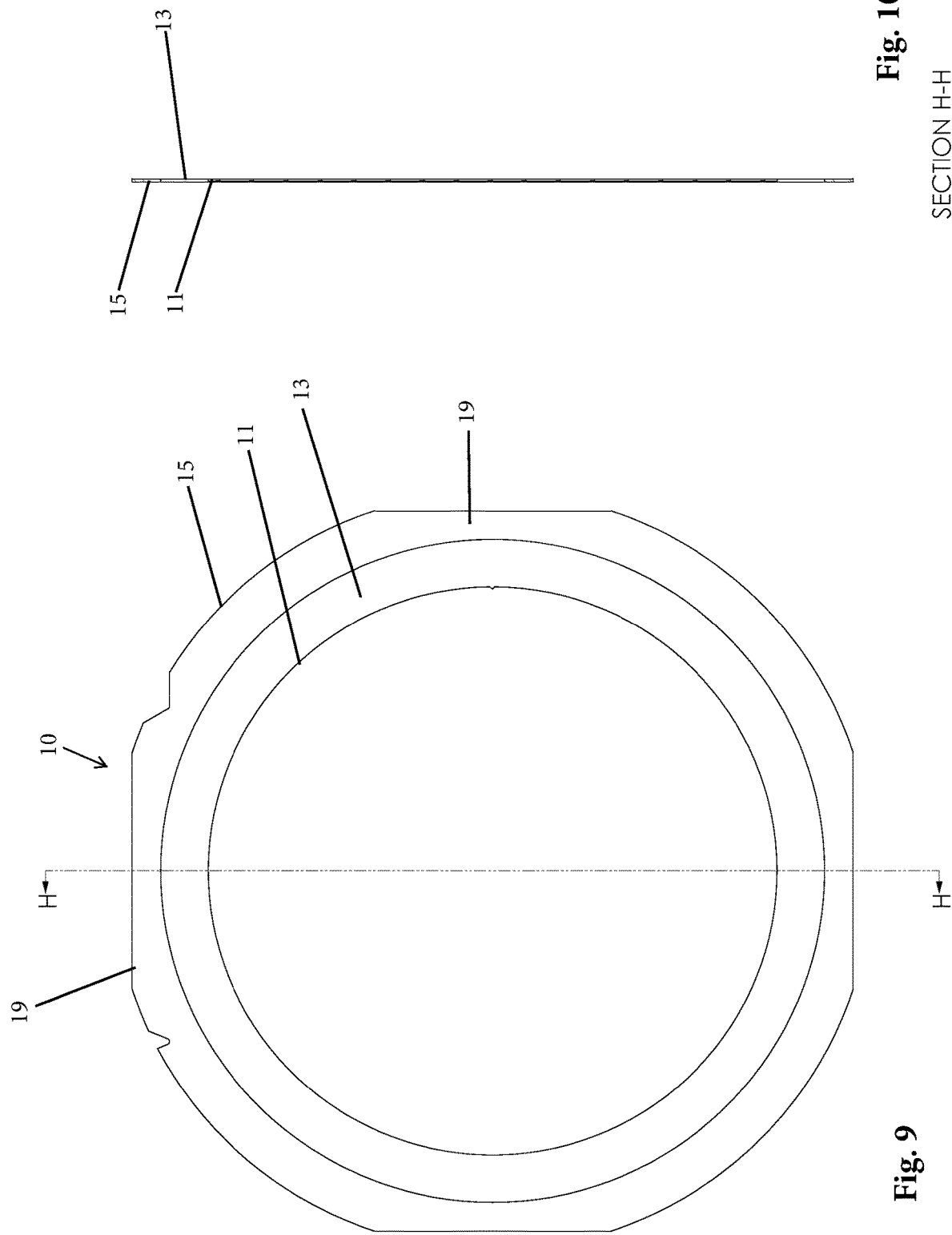

TWO-LEVEL TAPE FRAME RINSE ASSEMBLY

CROSS REFERENCE TO RELATED APPLICATION

The present application claims priority to and the benefit of U.S. patent application Ser. No. 62/373,096, filed Aug. 10, 2016, which is hereby incorporated by reference in its entirety.

TECHNICAL FIELD

The present invention relates to substrate (wafer) processing equipment and more specifically, to a two-level tape frame rinse assembly for grasping the substrate so as to create a gap between the substrate and a backside support plate that allows the backside of the wafer to be rinsed and spun dry after rinsing.

BACKGROUND

In order to facilitate processing of fragile substrate (e.g., thin silicon wafers on a tape frame) with high pressure sprays, a backside support plate is desirable. However, this creates a problem when incoming wafers are already wet, as any liquid trapped between the backside of the wafer and the support plate cannot be rinsed off. There is therefore a desire to provide an assembly/mechanism by which liquid trapped between the backside of the wafer and the support plate can be avoided.

SUMMARY

A two-level tape frame rinse assembly is provided for moving a substrate (wafer) into one of a plurality of positions. In at least one position, the wafer is grasped and elevated above a backside support plate so as to create a gap between the wafer and the backside support plate that allows the backside of the wafer to rinsed and spun dry.

BRIEF DESCRIPTION OF THE DRAWING FIGURES

FIG. 8 is a cross-sectional view showing a seventh step of unloading the substrate (wafer);

FIG. 9 is a top plan view of an exemplary film frame wafer; and

FIG. 10 is a cross-sectional view of the film frame wafer.

DETAILED DESCRIPTION OF CERTAIN EMBODIMENTS

The following description is directed to a two-level tape frame rinse assembly. The referenced device is now described more fully with reference to the accompanying drawings, in which one or more illustrated embodiments and/or arrangements of the apparatuses and methods are shown. The apparatuses and methods are not limited in any way to the illustrated embodiments and/or arrangements as the illustrated embodiments and/or arrangements described below are merely exemplary of the present apparatuses and methods, which can be embodied in various forms as appreciated by one skilled in the art. Therefore, it is to be understood that any structural and functional details disclosed herein are not to be interpreted as limiting the present application, but rather are provided as a representative embodiment and/or arrangement for teaching one skilled in the art one or more ways to implement the present apparatuses and/or methods. Moreover, just because a certain feature is depicted in combination with a particular set of other features, no intent to so limit the invention can be inferred and each feature can be combined with any other set of other features. Accordingly, certain aspects of the present apparatuses and methods can take the form of an entirely hardware embodiment or an embodiment combining software and hardware.

Figure 1:
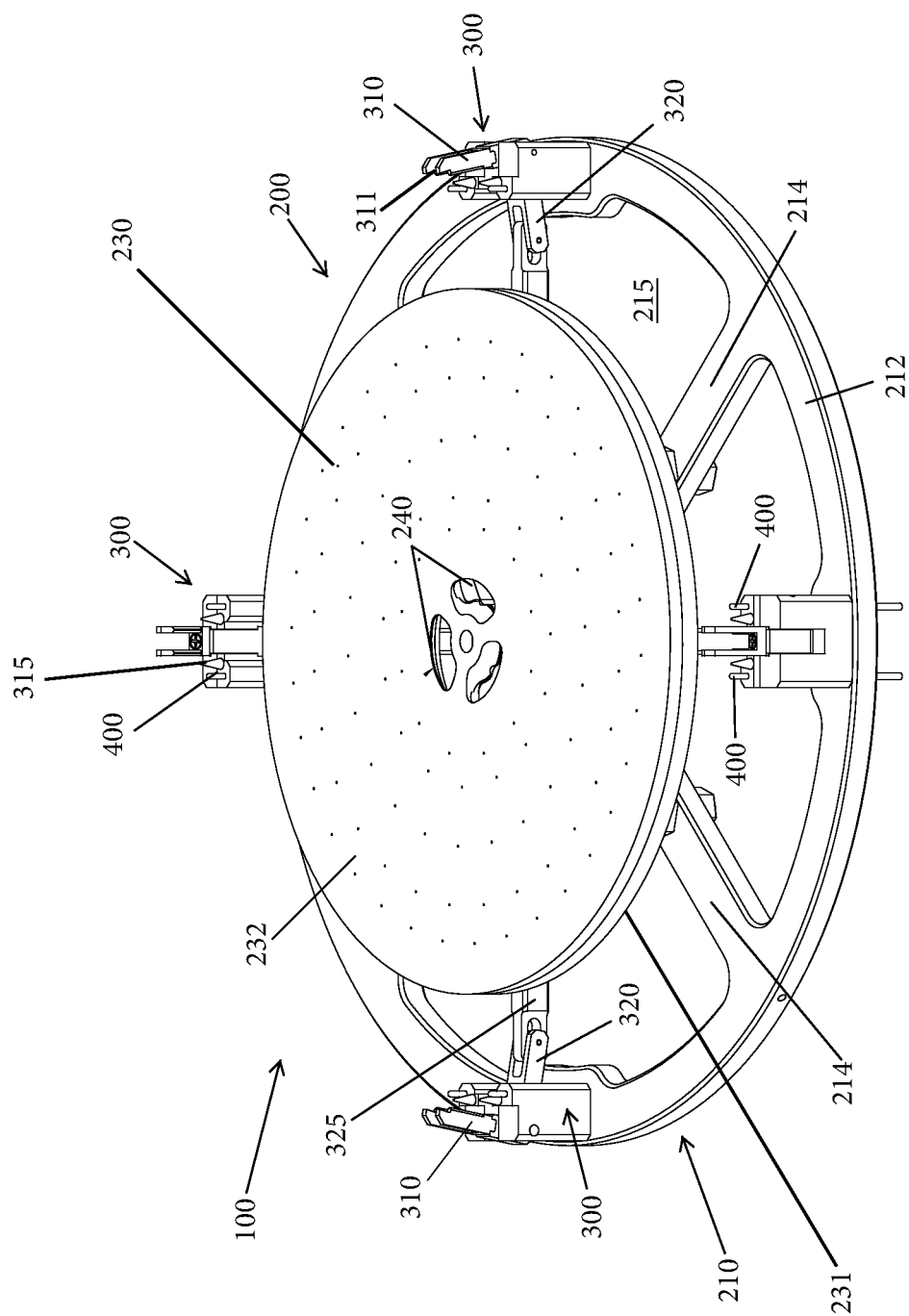
FIG. 1 is a perspective view of a two-level tape frame rinse assembly.
Figure 2:
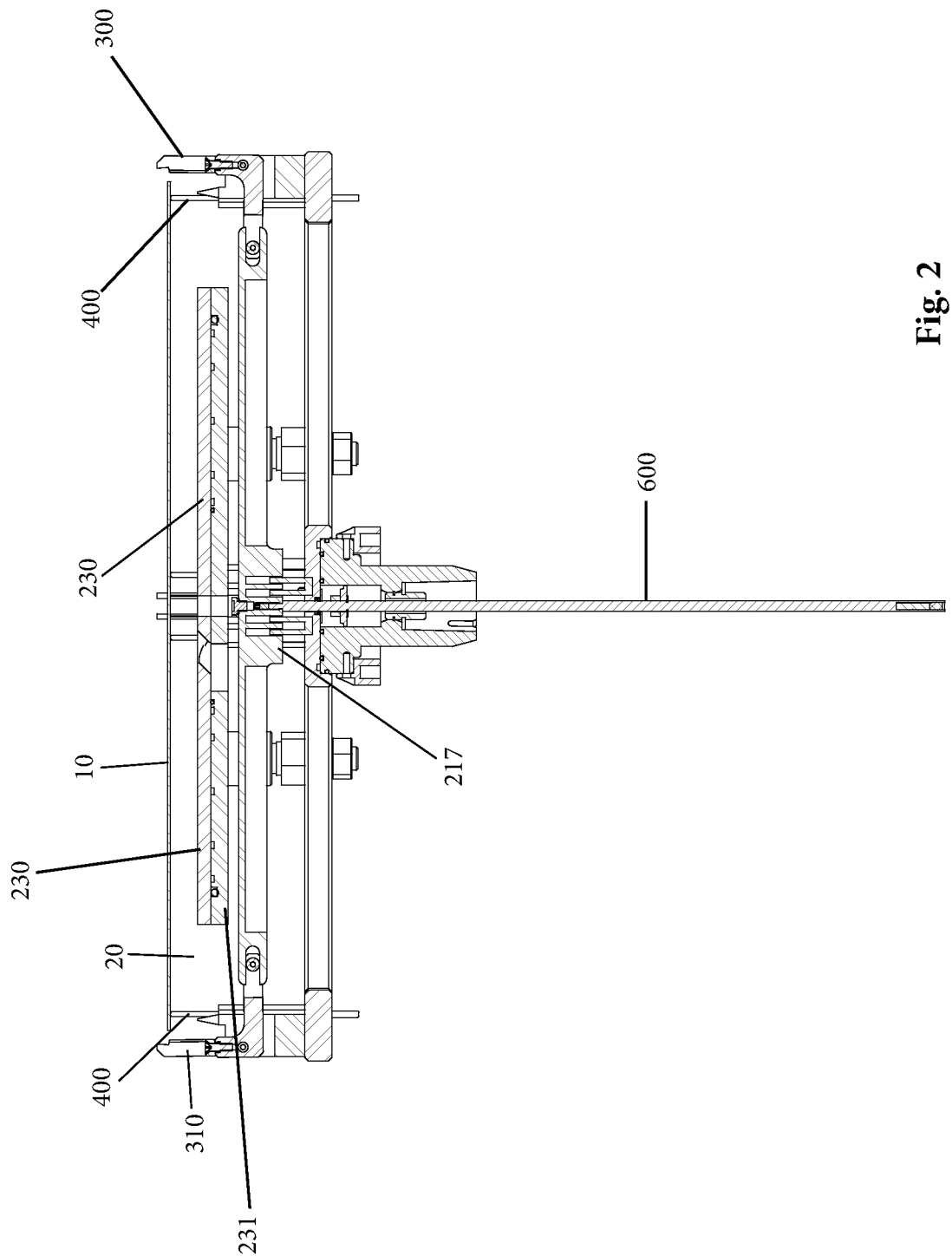
FIG. 2 is a cross-sectional view showing a first step of loading a substrate (wafer) onto the assembly.

FIG. 1 is a perspective view of a piece of wafer processing equipment and more particularly, a two-level tape frame rinse assembly 100 that includes a chuck assembly 200. The chuck assembly 200 includes a frame 210 which, as shown, has an annular shape. As described herein, the frame 210 rotates along with the other parts since it is coupled to a center hub that rotates under action of a motor of the like. As shown, the illustrated frame 210 includes an annular outer rail 212 with a plurality of spokes 214 that extend radially outward to the circular outer rail 212 to form an integrated structure. Open spaces 215 are formed between the spokes 214. The spokes 214 join to a center hub 217 (FIG. 2). A motor drives the operation of the chuck assembly 200 and the chuck assembly 200 can include conventional parts including a drive shaft, bearings, etc. As is understood, a chuck is a device which is driven in a rotating manner so as to controllably rotate a wafer or the like that is supported thereon and allow processing of the wafer.

The chuck assembly, as well as the other parts, described herein can be formed from any number of different materials, including but not limited to metal, plastic, etc.

The chuck assembly 200 includes a plurality of actuatable grippers (gripper units or mechanisms) 300 that move between different positions (states) for holding (gripping) and releasing a wafer. As shown, each gripper 300 can be an elevated structure that protrudes upwardly from the annular shaped outer rail 212 of frame 210 (which is connected to a rotating center hub). As shown, the outer rail 212 can include an area of increased width to support the grippers 300. The gripper 300 can thus take the form of a pedestal or the like.

Each gripper 300 moves between an open position and a closed position. Each gripper 300 includes a movable gripper finger 310 that is located at the top end of the gripper 300. The gripper finger 310 can pivot about a pivot axis to allow the gripper finger 310 to be pivoted in a radially inward manner to the closed position of the gripper 300 and in a radially outward manner to the open position of the gripper 300. When moving in the radially inward direction, the gripper finger 310 moves toward the center of the frame 210 and conversely, when the gripper fingers moves in a radially outward manner, it moves away from the center. The gripper 300 thus has a top surface from which the gripper finger 310 extends and is elevated. The gripper finger 310 preferably includes a notch 311 formed in distal end of the gripper finger 310. As illustrated, an inner edge of the gripper finger 310 can include the notch 311 formed therein.

The top surface also can include one or more supports 315 that extend upwardly therefrom. The support 315 can take any number of different forms including a conical shape as illustrated that supports the wafer when the wafer is in a select position (e.g., down position).

A linkage 320 or the like can be connected to the gripper finger 310 to cause the pivot movement of the gripper finger 310 to cause the gripper finger 310 to move between an open position and closed position. The linkage 320 is coupled to a gripper actuator 325 that allow controlled operation (movement) of the gripper fingers 310. As shown in the figures, the linkage 320 is connected to a center portion 321 that is part of the gripper actuator 325 and rotates along with the other components. The gripper actuator 325 is configured so that operation thereof imparts movement to the gripper 300 so as to cause pivoting thereof for positioning the gripper finger 310 in either the open or closed position. For example, the gripper actuator 325 can be a linear actuator that imparts movement to the linkage 320 causing pivoting of the gripper finger 310 that is coupled to the linkage 320. The gripper actuator 325 and the outer rail 212 which constitute parts of the frame 210 are coaxial to one another and configured to rotate in unison as part of the chuck assembly.

Figure 3:
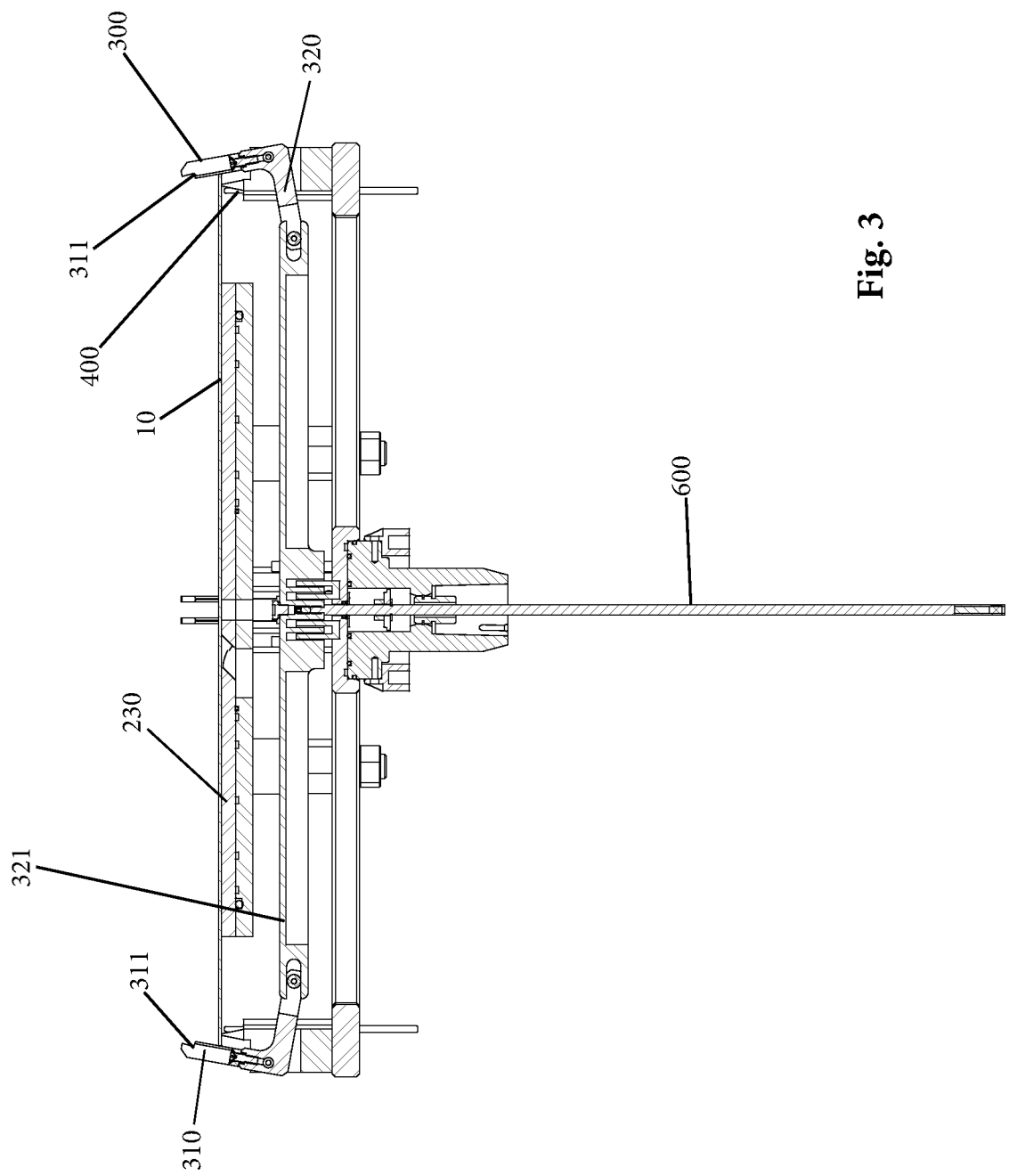
FIG. 3 is a cross-sectional view showing a second step of gripping the substrate (wafer)

In one embodiment, a drive rod 600 is provided and is operatively coupled to the actuator 325 such that up/down movement of the drive rod 600 is translated into left/right movement of the actuator 325. More specifically, when the drive rod 600 is in a raised position (up position) as shown in FIG. 2, the actuators 325 are pushed out and this causes the grippers 300 to be in the open position as shown. Conversely and as shown in FIG. 3, when the drive rod 600 is in a lowered position (down position), the actuators 325 are pulled inward and this causes the grippers to pivot inwardly to the closed position. It will be appreciated that other mechanisms can be used to cause the controlled movement of the grippers 300 including but not limited to use of motors and the like.

The grippers 300 are spaced circumferentially apart from one another about the annular outer rail 212. In the illustrated embodiment, there are four grippers 300 (positioned 90 degrees apart); however, it will be appreciated that there can be more than four grippers 300 or less than four grippers 300.

The grippers 300 also include one or more lifter pins 400 that extend upwardly from the top surface of the gripper 300. The lifter pins 400 are located radially inward from the gripper fingers 310. Each lifter pin 400 moves from a down position to an open (up) position and vice versa. The lifter pin 400 is located radially inward from the gripper finger 310. The lifter pin 400 can have any number of different shapes including being a cylindrical shaped pin or post. The lifter pins 400 are operated by an actuator and are independently movable relative to the gripper fingers 310 in that the lifter pins 400 can be maintained in one static position, while the gripper fingers 310 are moved and vice versa.

As shown, each gripper 300 can include two lifter pins 400 on opposite sides of one gripper finger 310 associated with one gripper unit/device 300.

The chuck assembly 200 includes a rotatable backside support plate 230 that can be seated on a substrate 231. As is known, the backside support plate 230 can be a flexible (compressible) pad or the like on which the wafer 10 is placed and underneath the backside support plate 230 is a rigid substrate (plate) 231. The backside support plate 230 (pad) can be formed of a number of different materials, having pad-like properties, such as nylon material, while the rigid substrate 231 can be formed of metal.

The rotatable backside support plate 230 is also operably connected to a motor so as to be driven along with the other components (e.g., chuck, etc.) connected to the center hub 217. The rotatable backside support plate 230 is disposed internally between the grippers 300. The rotatable backside support plate 230 is disk shaped and has a top surface 232. The rotatable backside support plate 230 (and the rigid substrate 231) includes a plurality of slots 240 formed therethrough and includes a number of openings (vacuum holes) that are connected to a vacuum source to generate a vacuum along the top surface 232 for holding the wafer to the top surface 232. As shown in FIG. 1, the slots 240 are formed centrally within the rotatable backside support plate 230 and has at least one angled edge. The slots 240 thus represent angled cuts formed through the plate 230. In the illustrated embodiment, the slots 240 are formed in a spaced circumferential manner and there are three slots 240. The slots 240 can take any number of different shapes and sizes, with the illustrated ones generally having a kidney bean shape.

As shown in the figures, each slot 240 can be defined by a side wall that is formed at an angle other than 90 degrees relative to the top and bottom surfaces of the backside support plate 230. As discussed below, the angling of the slot 240 permits a tool to be inserted at an angle.

When the wafer 10 is raised by raising the lifter pins 400, a gap 20 is formed between the backside of the wafer 10 and the top surface of the backside support plate 230 as shown in FIG. 2. In other words, the wafer 10 is elevated relative to the backside support plate 230, thereby providing direct access to the backside of the wafer 10 that is supported on the lifter pins 400.

First Step

FIG. 2 represents a first step in which the grippers 300 are opened by pivoting the gripper fingers 310 in a radially outward direction so that the gripper fingers 310 are disengaged (free of contact) with the peripheral edge of the wafer 10. In the first step, the lifter pins 400 are raised to the open position to allow for placement of the unprocessed wafer on the lifter pins 400. The unprocessed wafer 10 is thus supported by the lifter pins 400. The unprocessed wafer 10 is also above the support member 315.

Second Step

FIG. 3 represents a second step in which the unprocessed wafer 10 is lowered onto the backside support plate 230 by lowering the lifter pins 400 that are supporting the unprocessed wafer. As the lifter pins 400 are moved to the down (lowered) position, the unprocessed wafer 10 is moved towards the backside support plate 230 until the wafer 10 seats against the backside support plate 230. Once the lifter pins 400 are down, the grippers 300 are closed by pivoting the gripper fingers 310 in radially inward direction, such that the wafer 10 is held securely between the gripper fingers 310. The gripper fingers 310 thus grasp the wafer 10. The backside support plate 230 can also contain a vacuum hold down (vacuum holes) and at this time, such vacuum hold down mechanism is switched down. In other words, a vacuum is turned on which causes negative pressure to be generated along the top surface of the backside support plate 230.

As illustrated, when the wafer 10 seats against backside support plate 230 and is supported thereby, the gripper fingers 310 contact the wafer 10 at a location below the notches 311. In other words, when the gripper fingers 310 pivot and tilt inward, the elongated body of the gripper fingers 310 contact the wafer 10 (at locations below the notches 311). The force applied by the grippers 310 about the circumference of the wafer 10 results in the wafer 10 being held in place (lateral movement is prevented).

Third Step

Figure 4:
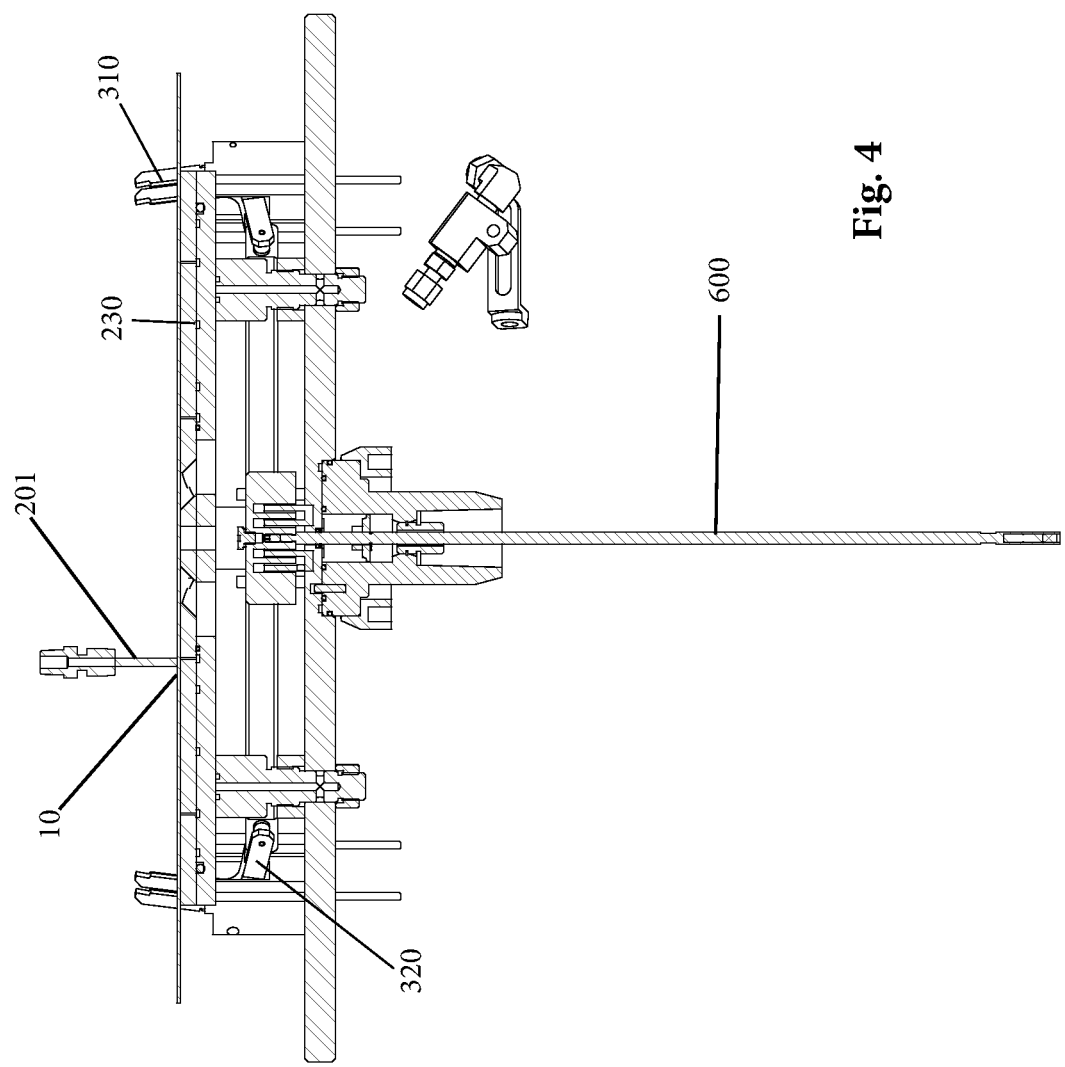
FIG. 4 is a cross-sectional view showing a third step of chemically processing the substrate (wafer)

FIG. 4 represents a third step. With the unprocessed wafer 10 securely gripped in the chuck assembly 200, the wafer 10 and the chuck assembly 200 are spun together. Then liquid chemistry under high pressure is dispensed through a mechanism (liquid chemistry dispensing arm) 201 onto the surface of the wafer 10. The backside support plate 230 prevents the high pressure from deforming or damaging the wafer during this step since the wafer 10 seats against and is supported by the backside support plate 230. The grippers 300 (including gripper fingers 310) remain in the same positions as in the second step (FIG. 3).

Fourth Step

Figure 5:
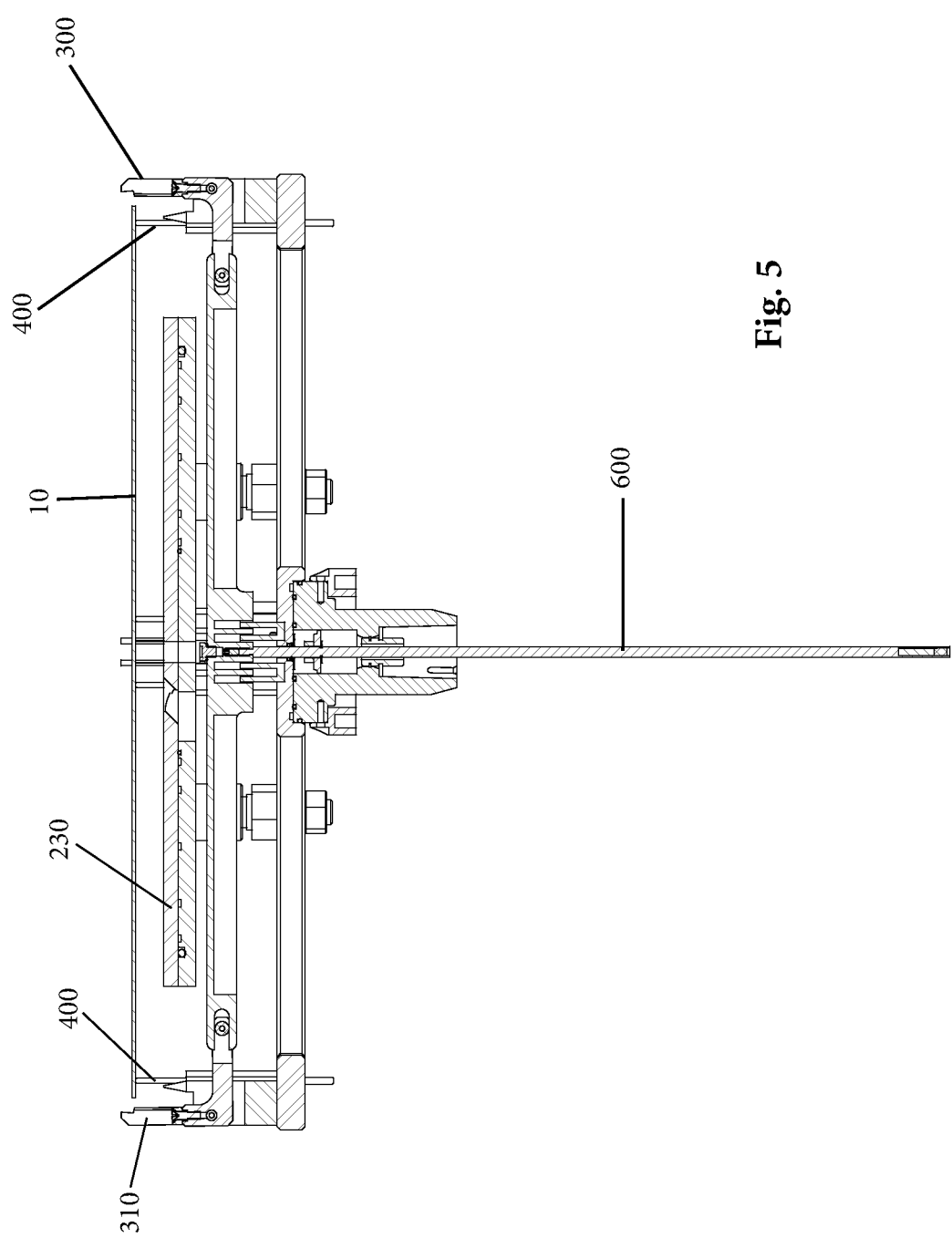
FIG. 5 is a cross-sectional view showing a fourth step of raising the substrate (wafer)

FIG. 5 represents a fourth step. Once the chemical processing is complete (i.e., completion of dispensing liquid chemistry through the dispensing arm 201), the chuck assembly 200 and the wafer 10 are stopped (rotation is ceased). Next, the grippers 300 (i.e., the gripper fingers 310) are opened by pivoting outward (so as to assume more vertical positions as shown in FIG. 5 and as opposed to the angled positions when the fingers 310 are in the closed positions), thereby releasing the wafer 10, and then the lifter pins 400 are raised, thereby moving the wafer 10 upward away from the backside support plate 230. This results in the wafer 10 being spaced above the backside support plate 230 and supported by the lifter pins 400.

Fifth Step

Figure 6:
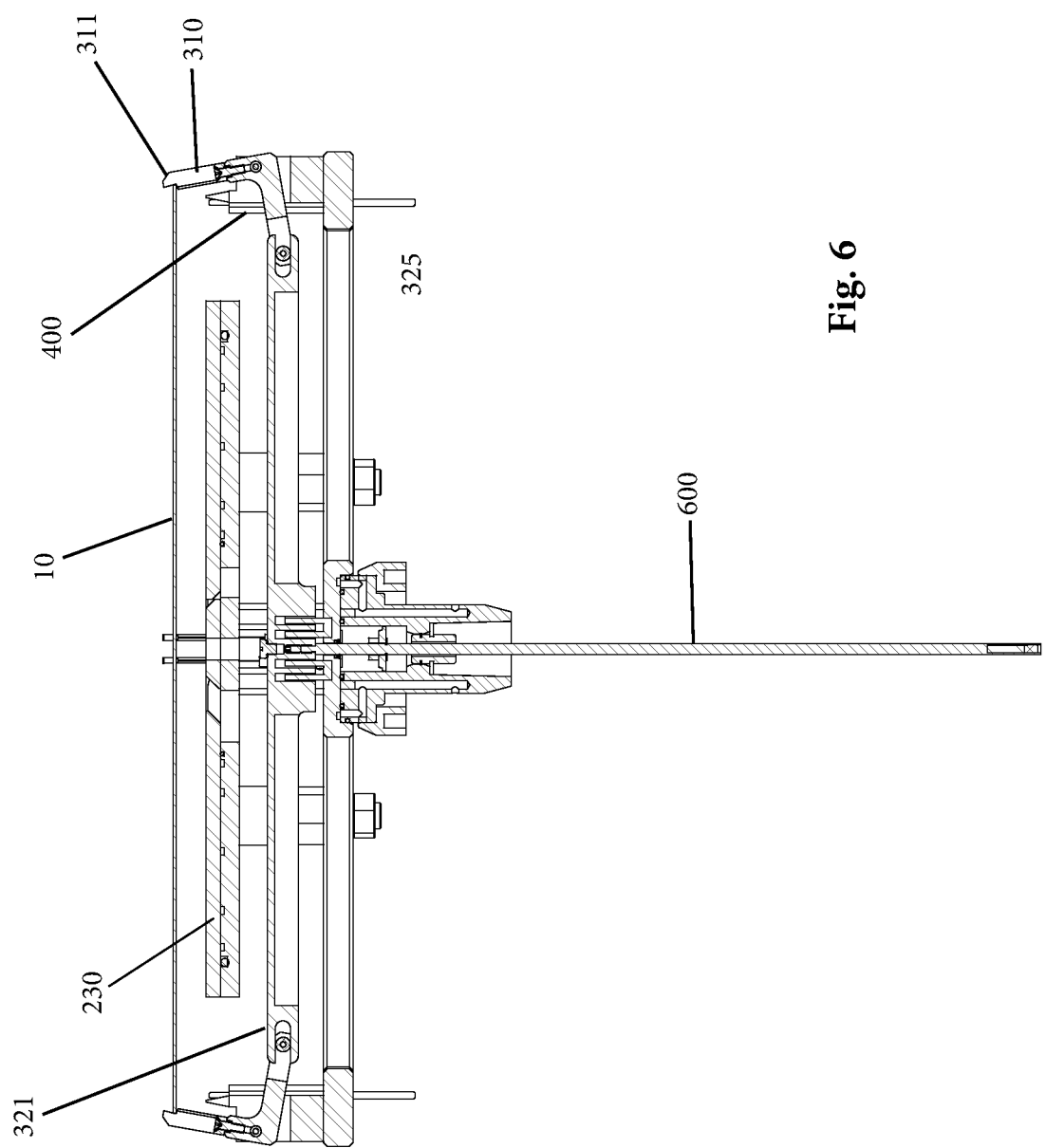
FIG. 6 is a cross-sectional view showing a fifth step of regripping the substrate (wafer) in an elevated (up) position.

FIG. 6 represents a fifth step. With the wafer 100 still raised up and supported by the lifter pins 400, the grippers 300 (i.e., gripping arms 310) are closed, which catches the wafer 10 in upper level notches 311 cut in the grippers 300. More particularly, when the grippers 300 (i.e., gripper fingers 310) are pivoted in a radially inward manner to the closed positions, the gripper fingers 310 are brought into contact with the peripheral edge of the wafer 10. However, when the wafer 10 is in the raised position, the upper level notches 311 are formed such that when the grippers 300 are in the closed position, the peripheral edge of the wafer 10 is received within the upper level notches 311. The cut edge upper level notch 311 defines a surface on which the bottom of the wafer can seat and the cut edge also prevents the wafer 10 from moving downward toward the backside support plate 230. In this position, the wafer 10 is securely gripped by the gripper fingers 310 and maintained in this elevated position.

Once the wafer 10 is securely gripped, the lifter pins 400 are lowered back down leaving the wafer 10 securely gripped by the grippers 300 above the backside support plate 230.

Sixth Step

Figure 7:
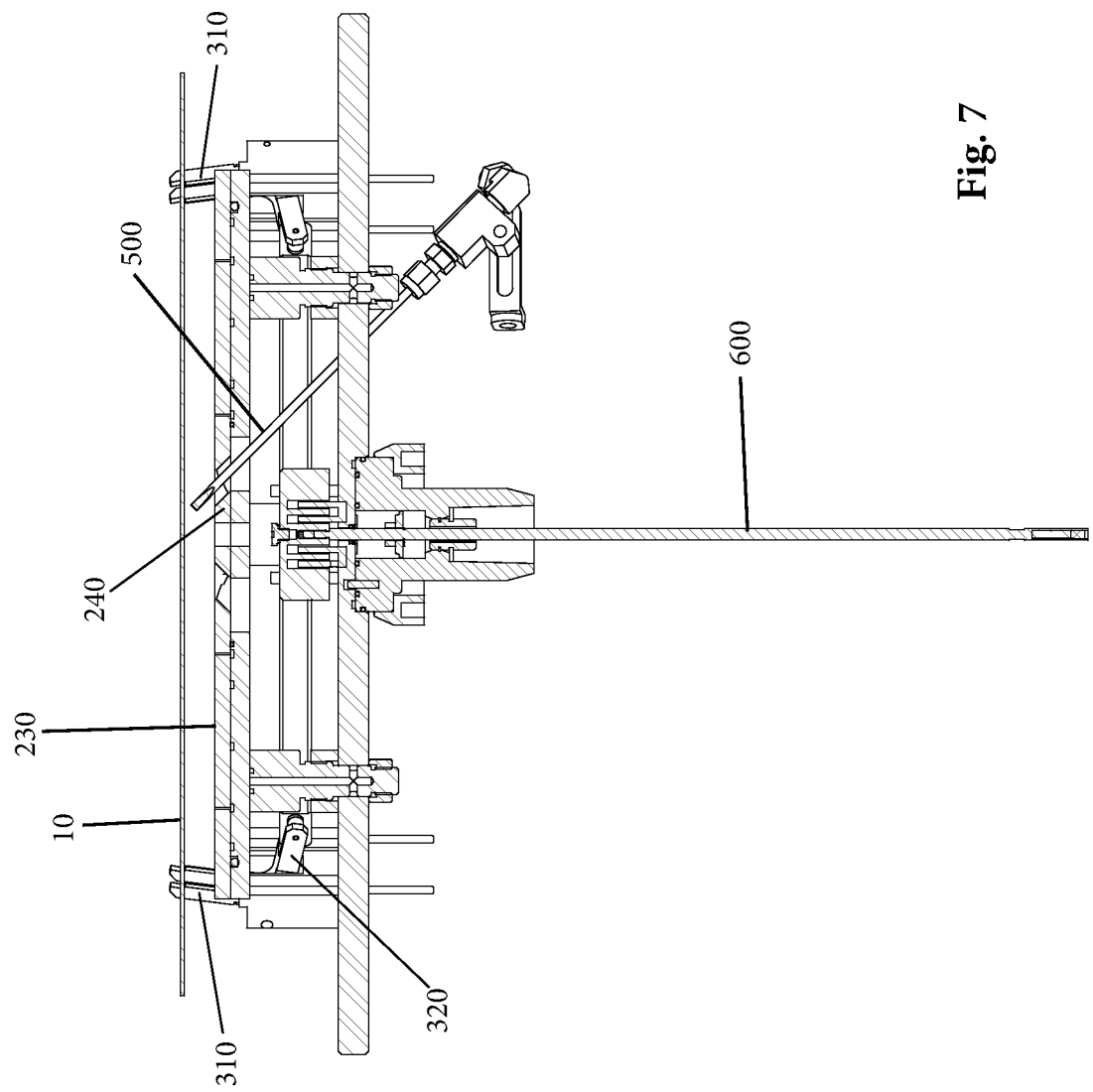
FIG. 7 is a cross-sectional view showing a sixth step of applying a backside rinse to the substrate (wafer)

FIG. 7 represents a sixth step. With the processed, but still wet wafer 10 securely gripped in the up position (by being held between the gripper fingers 310), the chuck assembly 200 and wafer 10 are spun together and one or more backside rinse nozzles 500 are turned on to dispense rinse fluid onto the backside of the wafer 10. When the rinse is completed, the liquid chemistry dispense is turned off and the chuck and wafer 10 are spun to dry the wafer 10. As can be seen in FIG. 6, the slots 240 permit access for the one or more rinse nozzles 500 to allow the dispensing of the rinse onto the backside of the wafer 10. As shown, the rinse nozzle 500 can be part of a device that has an elongated shaft with the nozzle 500 being at the distal end of the shaft. The shaft construction allows for insertion and placement of the nozzle 500 through the slot 240 and into position (close proximity) below the bottom surface of the wafer 10.

It will be appreciated that the frame 210 includes a number of open spaces, such as space 215 and the open space between the rails or spokes of the grip actuator 325 that extend from a center hub to the upstanding gripper 300.

FIG. 7 also shows the rod 600 for gripper position detection and to move the grippers between positions as discussed herein.

FIG. 7 thus shows a backside rinse operation that is made possible by positioning and holding the wafer 10 in an elevated, gripped position, that is spaced from the top surface of the backside support plate 230 so as to expose the backside (bottom surface) of the wafer 10 for treatment thereof.

Seventh Step

FIG. 8 represents a seventh step. Once the wafer 10 is rinsed and dried in the up position (i.e., clamped by the gripper fingers 310), the rotation of the chuck assembly 200 and wafer 10 is stopped. Next, the lifter pins 400 are raised so as to come into contact with the underside of the wafer 10. Last the grippers 300 are opened so that the wafer 10 simply rests on and is supported by the raised lifter pins 400. The gripper fingers 310 are thus pivoted from their closed position in which they are pivoted radially inward to their open position, in which the fingers are pivoted in a radially outward direction so as to position the gripper fingers 310 in vertical upright positions. From this position, the processed wafer 10 can be removed from the chuck by lifting the wafer 10 off of the lifter pins 400.

FIGS. 9 and 10 show an exemplary film frame wafer 10. The wafer 10 includes a wafer component 11, a tape film 13, and a frame 15. As shown, the frame 15 has a number of flats 19 (planar sections) formed about the circumference of the frame 15. As shown, the frame 15 can have four flats 19 that are spaced 90 degrees apart from one another. The grippers 300 are configured to engage the frame 15 in the flats 19; however, the grippers 300 can contact other areas of the wafer (frame) outside of the flats 19 for holding the wafer. The notch 311 is formed so as to contact and seat against the flat 19. It will be appreciated that the disclosed mechanism can be used with a variety of different wafers and is not limited to wafers disclosed and illustrated herein.

Notably, the figures and examples above are not meant to limit the scope of the present invention to a single embodiment, as other embodiments are possible by way of interchange of some or all of the described or illustrated elements. Moreover, where certain elements of the present invention can be partially or fully implemented using known components, only those portions of such known components that are necessary for an understanding of the present invention are described, and detailed descriptions of other portions of such known components are omitted so as not to obscure the invention. In the present specification, an embodiment showing a singular component should not necessarily be limited to other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

The foregoing description of the specific embodiments will so fully reveal the general nature of the invention that others can, by applying knowledge within the skill of the relevant art(s) (including the contents of the documents cited and incorporated by reference herein), readily modify and/or adapt for various applications such specific embodiments, without undue experimentation, without departing from the general concept of the present invention. Such adaptations and modifications are therefore intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance presented herein, in combination with the knowledge of one skilled in the relevant art(s).

While various embodiments of the present invention have been described above, it should be understood that they have been presented by way of example, and not limitation. It would be apparent to one skilled in the relevant art(s) that various changes in form and detail could be made therein without departing from the spirit and scope of the invention. Thus, the present invention should not be limited by any of the above-described exemplary embodiments, but should be defined only in accordance with the following claims and their equivalents.

What is claimed is:

1. A two-level tape frame rinse assembly for use in processing a wafer comprising:
   a rotatable chuck assembly,
   a plurality of grippers associated with the chuck assembly for selectively grasping the wafer, each gripper having a pivotable gripper finger, each gripper finger being movable between an open position and a closed position; the grippers including a plurality of lifter pins each being movable between an up position and a down position, the plurality of grippers being spaced circumferentially;
   a rotatable backside support plate associated with the chuck assembly for supporting the wafer, the backside support plate having a plurality of openings formed therethrough, the backside support plate being disposed internally between the plurality of grippers; and
   an annular shaped frame on which the grippers are disposed and fixed, the rotatable backside support plate being disposed internally within the annular shaped frame, each gripper protruding upwardly from the annular shaped frame, wherein the annular shaped frame is connected to a center hub by a plurality of spoke shaped supports;
   wherein in a first wafer position, the lifter pins are in the up position for supporting the wafer such that a gap is formed between a backside of the wafer and a top surface of the backside support plate,
   wherein in a second wafer position, the lifter pins are in the down position for allowing the wafer to seat against and be supported by the backside support plate;
   wherein in a third wafer position, the lifter pins are in the down position and the gripper fingers are in the closed position for grasping the wafer such that the gap is formed between the backside of the wafer and the top surface of the backside support plate to allow for a rinse tool to pass through one opening of the backside support plate and treat the backside of the wafer.

2. The two-level tape frame rinse assembly of claim 1, wherein each gripper finger is connected to a linkage that is coupled to a first actuator such that movement of the first actuator is translated into the gripper finger moving between the open position and the closed position.

3. The two-level tape frame rinse assembly of claim 1, wherein each gripper finger includes a notch formed along an inner side edge thereof that faces the backside support plate and is located proximate a distal end thereof, the notch being configured to receive a peripheral edge of the wafer for locking and holding the wafer in place.

4. The two-level tape frame rinse assembly of claim 1, wherein the lifter pins are independently operable relative to the gripper fingers.

5. The two-level tape frame rinse assembly of claim 1, wherein in the second wafer position, the gripper fingers contact and hold a peripheral edge of the wafer.

6. The two-level tape frame rinse assembly of claim 1, wherein the backside support plate is formed of a flexible material and is disposed on and fixed to a rigid support substrate that includes a plurality of holes that are in alignment with the plurality of openings formed in the backside support plate.

7. The two-level tape frame rinse assembly of claim 1, wherein the lifter pins are located radially inward relative to the gripper fingers.

8. A two-level tape frame rinse assembly for use in processing a wafer comprising:
   a rotatable chuck assembly,
   a plurality of grippers associated with the chuck assembly for selectively grasping the wafer, each gripper having a pivotable gripper finger, each gripper finger being movable between an open position and a closed position; the grippers including a plurality of lifter pins each being movable between an up position and a down position, the plurality of grippers being spaced circumferentially; and
   a rotatable backside support plate associated with the chuck assembly for supporting the wafer, the backside support plate having a plurality of openings formed therethrough, the backside support plate being disposed internally between the plurality of grippers;
   wherein in a first wafer position, the lifter pins are in the up position for supporting the wafer such that a gap is formed between a backside of the wafer and a top surface of the backside support plate,
   wherein in a second wafer position, the lifter pins are in the down position for allowing the wafer to seat against and be supported by the backside support plate;
   wherein in a third wafer position, the lifter pins are in the down position and the gripper fingers are in the closed position for grasping the wafer such that the gap is formed between the backside of the wafer and the top surface of the backside support plate to allow for a rinse tool to pass through one opening of the backside support plate and treat the backside of the wafer;
   wherein the pivotable gripper finger protrudes upwardly from a top surface of the gripper and each gripper includes one or more of the lifter pins that protrude upwardly from the top surface in at least the up position.

9. The two-level tape frame rinse assembly of claim 8, wherein the top surface further includes one or more upstanding fixed supports that support the wafer when the wafer is in the second wafer position.

10. A two-level tape frame rinse assembly for use in processing a wafer comprising:
    a rotatable chuck assembly,
    a plurality of grippers associated with the chuck assembly for selectively grasping the wafer, each gripper having a pivotable gripper finger, each gripper finger being movable between an open position and a closed position; the grippers including a plurality of lifter pins each being movable between an up position and a down position, the plurality of grippers being spaced circumferentially; and a rotatable backside support plate associated with the chuck assembly for supporting the wafer, the backside support plate having a plurality of openings formed therethrough, the backside support plate being disposed internally between the plurality of grippers;

wherein in a first wafer position, the lifter pins are in the up position for supporting the wafer such that a gap is formed between a backside of the wafer and a top surface of the backside support plate, wherein in a second wafer position, the lifter pins are in the down position for allowing the wafer to seat against and be supported by the backside support plate;

wherein in a third wafer position, the lifter pins are in the down position and the gripper fingers are in the closed position for grasping the wafer such that the gap is formed between the backside of the wafer and the top surface of the backside support plate to allow for a rinse tool to pass through one opening of the backside support plate and treat the backside of the wafer;

wherein each gripper finger is connected to a linkage that is coupled to a first actuator such that movement of the first actuator is translated into the gripper finger moving between the open position and the closed position; wherein movement of the first actuator in a first direction toward a center hub of the chuck assembly causes a respective gripper finger to move to the closed position, while movement of the actuator in a second direction away from the center hub causes the respective gripper finger to move to the open position.

11. The two-level tape frame rinse assembly of claim 10, wherein the first actuator is coupled to a drive rod that is centrally disposed within the center hub, whereby upward movement of the drive rod toward the center hub causes the first actuator to move in the first direction and downward movement of the drive rod away from the center hub causes the first actuator to move in the second direction.

12. A two-level tape frame rinse assembly for use in processing a wafer comprising:

a rotatable chuck assembly, a plurality of grippers associated with the chuck assembly for selectively grasping the wafer, each gripper having a pivotable gripper finger, each gripper finger being movable between an open position and a closed position; the grippers including a plurality of lifter pins each being movable between an up position and a down position, the plurality of grippers being spaced circumferentially; and a rotatable backside support plate associated with the chuck assembly for supporting the wafer, the backside support plate having a plurality of openings formed therethrough, the backside support plate being disposed internally between the plurality of grippers;

wherein in a first wafer position, the lifter pins are in the up position for supporting the wafer such that a gap is formed between a backside of the wafer and a top surface of the backside support plate, wherein in a second wafer position, the lifter pins are in the down position for allowing the wafer to seat against and be supported by the backside support plate;

wherein in a third wafer position, the lifter pins are in the down position and the gripper fingers are in the closed position for grasping the wafer such that the gap is formed between the backside of the wafer and the top surface of the backside support plate to allow for a rinse tool to pass through one opening of the backside support plate and treat the backside of the wafer;

wherein the plurality of openings are circumferentially spaced apart and are defined by angled side walls to permit a tool to be inserted therethrough at an angle other than 90 degrees relative to the backside support plate.

13. The two-level tape frame rinse assembly of claim 12, wherein the openings are spaced radially about a center of the backside support plate.

14. A two-level tape frame rinse assembly for use in processing a wafer comprising:

a rotatable chuck assembly, a plurality of grippers associated with the chuck assembly for selectively grasping the wafer, each gripper having a pivotable gripper finger, each gripper finger being movable between an open position and a closed position; the grippers including a plurality of lifter pins each being movable between an up position and a down position, the plurality of grippers being spaced circumferentially;

a rotatable backside support plate associated with the chuck assembly for supporting the wafer, the backside support plate having a plurality of openings formed therethrough, the backside support plate being disposed internally between the plurality of grippers; and fixed protrusions that protrude upwardly from top surfaces of the grippers, wherein in the second wafer position, the wafer rests on the fixed protrusions;

wherein in a first wafer position, the lifter pins are in the up position for supporting the wafer such that a gap is formed between a backside of the wafer and a top surface of the backside support plate, wherein in a second wafer position, the lifter pins are in the down position for allowing the wafer to seat against and be supported by the backside support plate;

wherein in a third wafer position, the lifter pins are in the down position and the gripper fingers are in the closed position for grasping the wafer such that the gap is formed between the backside of the wafer and the top surface of the backside support plate to allow for a rinse tool to pass through one opening of the backside support plate and treat the backside of the wafer.

* * * * *